(12) United States Patent
Norimatsu

(10) Patent No.: US 8,186,029 B2
(45) Date of Patent: May 29, 2012

(54) METHOD FOR PRODUCING PIEZOELECTRIC ACTUATOR AND METHOD FOR PRODUCING LIQUID DISCHARGE HEAD

(75) Inventor: Takahiro Norimatsu, Hekinan (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 580 days.

(21) Appl. No.: 12/345,583

(22) Filed: Dec. 29, 2008

(65) Prior Publication Data

US 2009/0165271 A1 Jul. 2, 2009

(30) Foreign Application Priority Data

Dec. 29, 2007 (JP) ................................ 2007-341550

(51) Int. Cl.
*H04R 17/10* (2006.01)
*H01L 41/24* (2006.01)
*B05D 5/12* (2006.01)

(52) U.S. Cl. ........ 29/25.35; 29/846; 427/96.7; 427/100; 310/324

(58) Field of Classification Search ................. 29/25.35, 29/846, 890.1; 427/96.7, 100, 901; 310/324, 310/342; 347/70
See application file for complete search history.

(56) References Cited

U.S. PATENT DOCUMENTS

| 7,677,707 | B2 * | 3/2010 | Lee et al. | ......................... 347/70 |
| 2005/0225208 | A1 | 10/2005 | Yasui et al. | |
| 2006/0012644 | A1 | 1/2006 | Yasui | |
| 2006/0012646 | A1 | 1/2006 | Yasui | |
| 2006/0044359 | A1 | 3/2006 | Sugahara | |
| 2007/0130740 | A1 | 6/2007 | Mita | |
| 2008/0084458 | A1 | 4/2008 | Sugahara | |

FOREIGN PATENT DOCUMENTS

| JP | 2004122341 A | * | 4/2004 |
| JP | 2005-286153 A | | 10/2005 |
| JP | 2006-054442 A | | 2/2006 |
| JP | 2006-096034 A | | 4/2006 |
| JP | 2007-227408 A | | 9/2007 |
| JP | 2007-229961 A | | 9/2007 |
| JP | 2007253099 A | * | 10/2007 |

* cited by examiner

*Primary Examiner* — A. Dexter Tugbang
(74) *Attorney, Agent, or Firm* — Baker Botts L.L.P.

(57) ABSTRACT

A method for producing a piezoelectric actuator having a diffusion-preventive layer and a piezoelectric layer stacked on a vibration plate includes providing the vibration plate having a surface on which a groove is formed; and blowing an aerosol containing ceramics particles toward an area, on the surface of the vibration plate, in which the groove is formed from a first direction and a second direction different from the first direction by using an aerosol deposition method to form the diffusion-preventive layer on the vibration plate. The aerosol is blown toward the vibration plate in the first and second directions. Therefore, the material particles contained in the aerosol can be collided with the inner walls of the groove formed on the vibration plate as well, and thus the diffusion-preventive layer can be formed on the vibration plate without causing any unevenness.

10 Claims, 8 Drawing Sheets

SCANNING DIRECTION
PAPER FEEDING DIRECTION

PAPER FEEDING DIRECTION

SCANNING DIRECTION

METHOD FOR PRODUCING PIEZOELECTRIC ACTUATOR AND METHOD FOR PRODUCING LIQUID DISCHARGE HEAD

CROSS REFERENCE TO RELATED APPLICATION

The present application claims priority from Japanese Patent Application No. 2007-341550, filed on Dec. 29, 2007, the disclosure of which is incorporated herein by reference in its entirety.

BACKGROUND OF THE INVENTION

1. Field of the Invention

The present invention relates to methods for producing a piezoelectric actuator and a liquid discharge head based on the use of the aerosol deposition method.

2. Description of the Related Art

A certain kind of ink-jet head, which is provided for an ink-jet printer, includes a piezoelectric actuator and a flow passage unit in which nozzle openings and ink flow passages communicating with the nozzle openings are formed. The piezoelectric actuator has a vibration plate which covers openings of pressure chambers formed in the ink flow passages of the flow passage unit. A lower electrode, a piezoelectric layer, and an upper electrode are stacked on the vibration plate. When the electric field is applied between the lower electrode and the upper electrode, the vibration plate is flexibly bent or warped in accordance with the deformation of the piezoelectric layer. The ink contained in the pressure chamber is pressurized, and the ink is discharged from the nozzle opening.

An annealing treatment is applied to the stack of the vibration plate and the piezoelectric layer in the steps of producing the piezoelectric actuator as described above in order that the piezoelectric characteristic, which is required to sufficiently warp the vibration plate, is given to the piezoelectric layer. However, when the annealing treatment is performed at a high temperature exceeding 600° C., then any element contained in the vibration plate is diffused into the piezoelectric layer, and the piezoelectric characteristic of the piezoelectric layer is deteriorated in some cases. A vibration plate made of stainless steel is often used for the piezoelectric actuator, because stainless steel is cheap and excellent in the processability. However, since stainless steel contains metal elements such as Fe and Cr which are easily diffused into the piezoelectric layer, the diffusion of the elements contained in the vibration plate into the piezoelectric layer is especially conspicuous. In view of the above, a piezoelectric actuator is provided, which is provided with a layer of an insulating oxide such as alumina as a diffusion-preventive layer between the vibration plate and the piezoelectric layer.

In the piezoelectric actuator, grooves are sometimes formed at positions of the vibration plate corresponding to the spaces between the pressure chambers in order that the pressure chambers, which are arranged closely and adjacently, are prevented from any interference, and the vibration plate is warped to such an extent that the liquid droplets can be jetted even when a relatively low voltage is applied. As a method for producing such a piezoelectric actuator, Japanese Patent Application Laid-open No. 2006-96034 discloses that a diffusion-preventive layer is formed by using the aerosol deposition method (hereinafter referred to as "AD method") on a vibration plate previously formed with grooves, and a piezoelectric layer is further formed on the diffusion-preventive layer by using the AD method.

In this context, the AD method is such a film formation method that a film containing a component of material particles is formed on a film formation surface by jetting a preparation (aerosol) obtained by dispersing the material particles in a gas toward the film formation surface, and making the material particles collide with the film formation surface so that the material particles are deposited thereon. In general, a film-forming apparatus for carrying out the AD method includes a pressure-reducing vessel, an aerosol generator, and a jetting nozzle connected to the aerosol generator. The film formation objective is arranged movably in the horizontal direction on the ceiling of the pressure-reducing vessel. The jetting nozzle is arranged under or below the film formation objective so that the jetting direction thereof is substantially perpendicular to the film formation objective surface of the film formation objective. The relative position of the film formation surface is changed with respect to the jetting nozzle by moving the film formation objective substantially in the horizontal direction while fixing the jetting nozzle, and thus the aerosol is blown toward a wide range of the film formation objective surface.

As described in Japanese Patent Application Laid-open No. 2006-96034 as well, the AD method can be used in order to form the diffusion-preventive layer on the vibration plate in the steps of producing the piezoelectric actuator. However, the angle, which is formed by the film formation objective surface of the film formation objective and the jetting direction of the jetting nozzle, is maintained to be substantially constant in the film-forming apparatus for carrying out the AD method. Therefore, the dead angle or dead area, against which the aerosol jetted from the jetting nozzle does not abut, appears on the inner wall of the groove depending on the shape of the groove provided on the vibration plate. A portion appears, in which the thickness of the diffusion-preventive layer is extremely small. In such a situation, if the annealing treatment is applied to the stack of the vibration plate, the diffusion-preventive layer, and the piezoelectric layer, then the elements of the vibration plate are diffused into the piezoelectric layer from the portion at which the thickness of the diffusion-preventive layer is insufficient, and the piezoelectric characteristic of the piezoelectric layer is deteriorated.

SUMMARY OF THE INVENTION

The present invention has been made taking the foregoing circumstances into consideration, an object of which is to provide a method for producing a piezoelectric actuator provided with a diffusion-preventive layer formed by using the AD method on a vibration plate provided with grooves and a method for producing a liquid discharge head. Specifically, an object of the present invention is to provide such a technique that any portion, at which the thickness of the diffusion-preventive layer is extremely small, is eliminated from inner walls of the grooves provided on the vibration plate to suppress the diffusion of metal elements contained in the vibration plate into a piezoelectric layer, and the deterioration of the piezoelectric characteristic of the piezoelectric actuator is avoided.

According to a first aspect of the present invention, there is provided a method for producing a piezoelectric actuator having a diffusion-preventive layer and a piezoelectric layer stacked on a vibration plate; the method including: providing the vibration plate having a surface on which a groove is formed; and blowing an aerosol containing ceramics particles toward an area, on the surface of the vibration plate, in which the groove is formed from a first direction and a second direction different from the first direction by using an aerosol deposition method to form the diffusion-preventive layer on the vibration plate, and the ceramics particles are ceramic particles which prevent diffusion of an element contained in the vibration plate into the piezoelectric layer.

According to the first aspect of the present invention, when the diffusion-preventive layer is formed on the vibration plate by using the aerosol deposition method, the aerosol is blown toward the vibration plate in the first direction and the second direction different from the first direction. Therefore, the material particles contained in the aerosol collide with the inner walls of the groove formed on the vibration plate as well, and the diffusion-preventive layer can be formed on the vibration plate without causing any unevenness. Therefore, the diffusion of elements contained in the vibration plate into the piezoelectric layer is reliably suppressed when the annealing treatment is applied, and it is possible to avoid the deterioration of the piezoelectric characteristic.

In the method for producing the piezoelectric actuator of the present invention, the vibration plate may be formed of a metal material. In this case, when the annealing treatment is performed, it is possible to suppress the diffusion of the metal element contained in the vibration plate into the piezoelectric layer. It is possible to avoid the deterioration of the piezoelectric characteristic.

In the method for producing the piezoelectric actuator of the present invention, a minimum portion, at which a film thickness of the diffusion-preventive layer formed on the groove of the vibration plate is minimum when the aerosol is blown from the first direction, may be located at a position different from that of the minimum portion when the aerosol is blown from the second direction.

In the method for producing the piezoelectric actuator of the present invention, both of the first direction and the second direction may have inclinations which are not perpendicular to the surface of the vibration plate; and a component of the first direction substantially parallel to the surface of the vibration plate and a component of the second direction substantially parallel to the surface of the vibration plate both may have inclinations with respect to an extending direction in which the groove of the vibration plate extends.

The method for producing the piezoelectric actuator of the present invention may further include forming an electrode, which applies a voltage to the piezoelectric layer, at a predetermined position on the diffusion-preventive layer formed on the vibration plate.

The method for producing the piezoelectric actuator of the present invention may further include blowing an aerosol containing particles of a piezoelectric material toward the surface of the vibration plate, on which the diffusion-preventive layer is formed, by using the aerosol deposition method to form the piezoelectric layer.

In the method for producing the piezoelectric actuator of the present invention, the aerosol containing the particles of the piezoelectric material may be blown from one direction toward the surface of the vibration plate on which the groove is formed. Further, the one direction may be a direction which is perpendicular to the surface of the vibration plate on which the groove is formed.

The method for producing the piezoelectric actuator of the present invention may further include forming another electrode, which applies the voltage to the piezoelectric layer, at a predetermined position on the piezoelectric layer.

According to a second aspect of the present invention, there is provided a method for producing a piezoelectric actuator having a diffusion-preventive layer and a piezoelectric layer stacked on a vibration plate; the method including: providing the vibration plate on which a groove is formed; forming the piezoelectric layer; and forming the diffusion-preventive layer by blowing an aerosol containing ceramics particles from a plurality of different directions toward a surface of the vibration plate, on which the groove is formed, by using an aerosol deposition method before forming the piezoelectric layer, and the ceramics particles are ceramic particles which prevent diffusion of an element contained in the vibration plate into the piezoelectric layer.

According to a third aspect of the present invention, there is provided a method for producing a liquid discharge head having the piezoelectric actuator produced by the method for producing the piezoelectric actuator according to the first aspect and a flow passage unit formed with a plurality of individual liquid flow passages including pressure chambers; the method including: forming the flow passage unit by stacking and joining a plurality of metal plates in each of which holes for defining the individual liquid flow passages are formed; and joining the flow passage unit and the vibration plate of the piezoelectric actuator to cover the pressure chambers of the individual liquid flow passages with the vibration plate.

In the method for producing the liquid discharge head of the present invention, the groove formed on the vibration plate may be formed as a plurality of grooves, and the grooves may be formed at positions corresponding to portions, of the flow passage unit, surrounding the pressure chambers.

DESCRIPTION OF THE PREFERRED EMBODIMENTS

Figure 1:
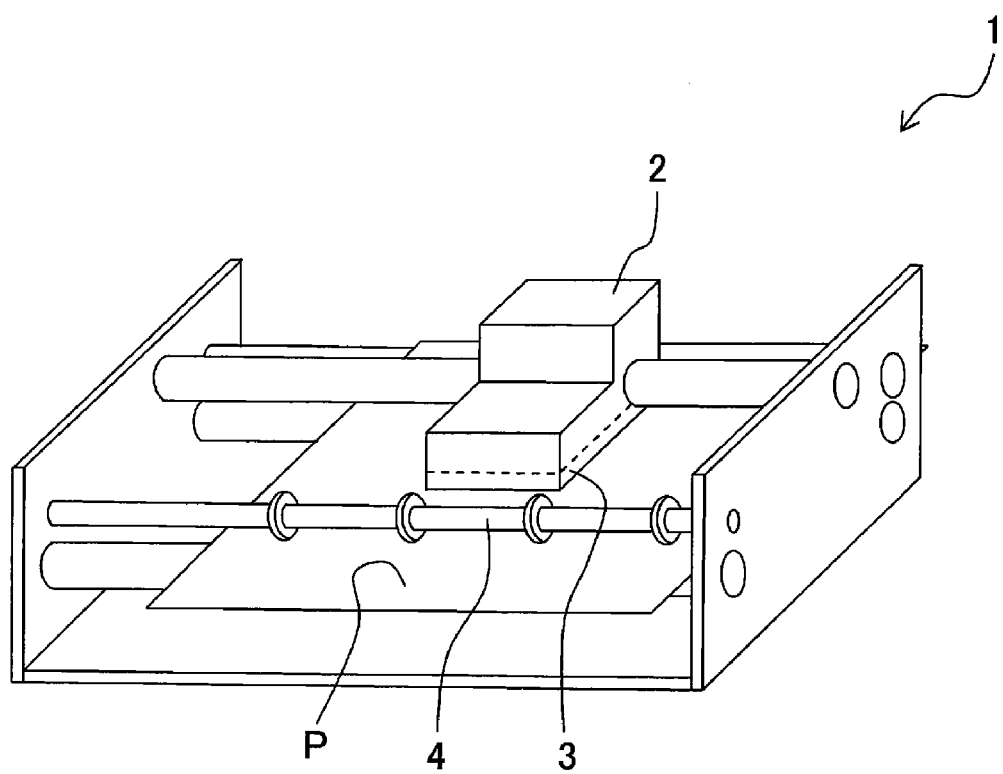
FIG. 1 shows a schematic arrangement of a printer according to an embodiment of the present invention.

An explanation will be made with reference to the drawings about a preferred embodiment of the present invention.

In the following description, the same or corresponding elements are designated by the same reference numerals through all of the drawings, any duplicate explanation of which will be omitted.

FIG. 1 shows a schematic arrangement of a printer according to the embodiment of the present invention. As shown in FIG. 1, the printer 1 includes, for example, a carriage 2, an ink-jet head 3 (liquid discharge head), and a printing paper transport roller 4.

The carriage 2 reciprocates in the leftward and rightward directions in FIG. 1 (in the scanning direction). The ink-jet head 3 is attached to the lower surface of the carriage 2, and the inks are discharged from nozzles 20 (see FIG. 2) as described later on. The printing paper transport roller 4 transports the recording paper P in the direction directed toward the front of FIG. 1 (in the paper feeding direction). The printer 1 performs the printing on the recording paper P by discharging the inks, from the nozzles 20 of the ink-jet head 3 which reciprocates in the scanning direction together with the carriage 2, onto the recording paper P which is transported in the paper feeding direction by the printing paper transport roller 4.

Figure 2:
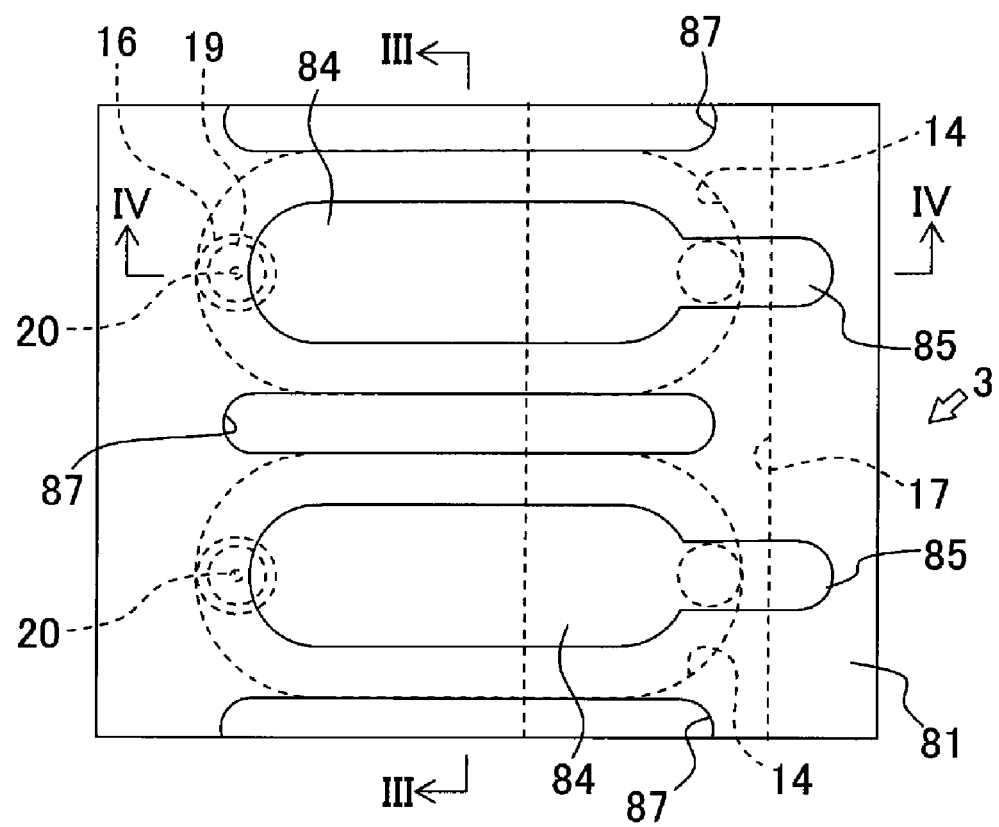
FIG. 2 shows a partial plan view illustrating an ink-jet head shown in FIG. 1.
Figure 2:
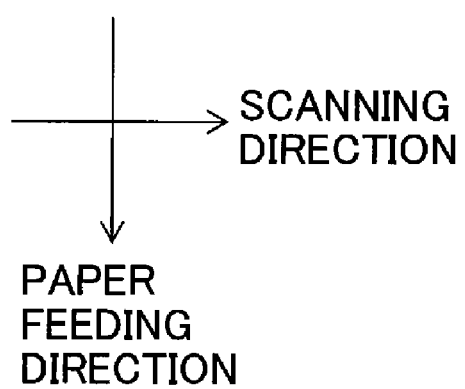
Figure 3:
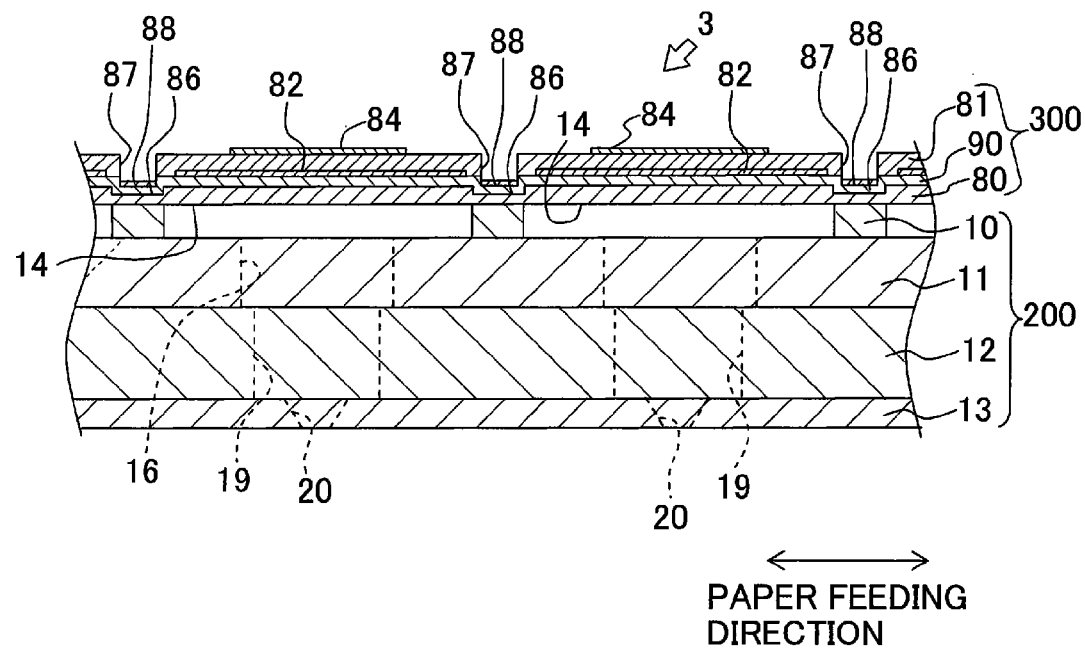
FIG. 3 shows a sectional view taken along a line III-III shown in FIG. 2.
Figure 4:
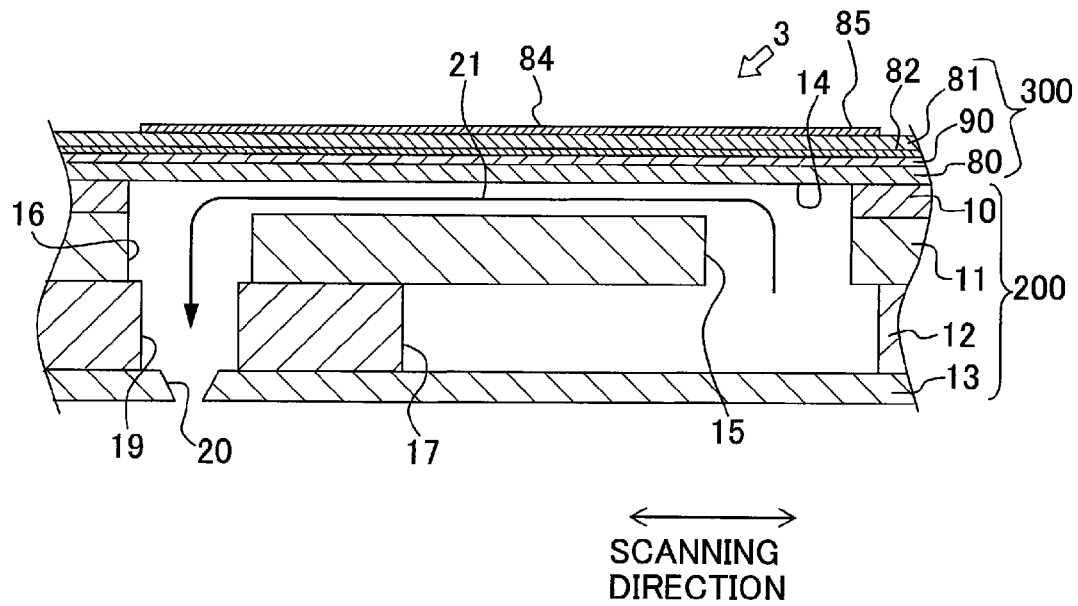
FIG. 4 shows a sectional view taken along a line IV-IV shown in FIG. 2.

Next, the ink-jet head 3 will be explained with reference to FIGS. 2 to 4. FIG. 2 shows a partial plan view illustrating the ink-jet head 3 shown in FIG. 1. FIG. 3 shows a sectional view taken along a line III-III shown in FIG. 2. FIG. 4 shows a sectional view taken along a line IV-IV shown in FIG. 2.

As shown in FIG. 4, the ink-jet head 3 includes a flow passage unit 200 in which individual liquid flow passages 21 including pressure chambers 14 are formed, and a piezoelectric actuator 300 which is stacked on the upper surface of the flow passage unit 200.

At first, the structure of the flow passage unit 200 will be explained. The flow passage unit 200 is provided with a pressure chamber plate 10, a base plate 11, a manifold plate 12, and a nozzle plate 13. The four plates 10 to 13 are stacked and bonded to one another. In particular, the pressure chamber plate 10, the base plate 11, and the manifold plate 12 are plates made of stainless steel. The individual liquid flow passages 21, which include, for example, a manifold 17 and the pressure chambers 14 as described later on, are formed by using the etching on the three plates 10 to 12. On the other hand, the nozzle plate 13 is formed of, for example, a high molecular weight synthetic resin material such as polyimide. The nozzle plate 13 is bonded to the lower surface of the manifold plate 12. Alternatively, the nozzle plate 13 may be also formed of a metal material such as stainless steel in the same manner as the three plates 10 to 12.

The plurality of pressure chambers 14 are formed on the pressure chamber plate 10. The plurality of pressure chambers 14 are open on the surface of the flow passage unit 200 (on the upper surface of the pressure chamber plate 10 to which a vibration plate 80 is joined as described later on). Each of the pressure chambers 14 is formed to have a substantially elliptic (oval) shape as viewed in a plan view. The longitudinal direction of the pressure chamber 14 is coincident with the scanning direction of the ink-jet head 3.

Communication holes 15, 16 are formed respectively at positions of the base plate 11 overlapped with the both ends of the pressure chamber 14 in the longitudinal direction as viewed in a plan view. The manifold 17, which extends in the direction (paper feeding direction) substantially perpendicular to the longitudinal direction of the pressure chambers 14 and which is overlapped with any one of the ends, of the pressure chambers 14, in the longitudinal direction, is formed on the manifold plate 12. The ink is supplied to the manifold 17 from an ink tank (not shown) via an ink supply port (not shown) formed on the pressure chamber plate 10. Communication holes 19 are also formed at positions overlapped with the ends of the pressure chambers 14 disposed on the side opposite to the manifold 17 as viewed in a plan view. The plurality of nozzles 20 are formed through the nozzle plate 13 at positions overlapped with the plurality of communication holes 19 respectively as viewed in a plan view. The nozzles 20 are formed, for example, by applying the excimer laser processing to the substrate made of the high molecular weight synthetic resin such as polyimide.

The manifold 17 is communicated with the pressure chambers 14 via the communication holes 15, and the pressure chambers 14 are communicated with the nozzles 20 via the communication holes 16, 19. As described above, the individual liquid flow passages 21, which range from the manifold 17 via the pressure chambers 14 to the nozzles 20, are formed in the flow passage unit 200.

Next, the structure of the piezoelectric actuator 300 will be explained. The piezoelectric actuator 300 is provided with the conductive vibration plate 80 which is arranged on the upper surface of the flow passage unit 200, a diffusion-preventive layer 90 which is formed on the upper surface of the vibration plate 80, a lower electrode 82 which is formed on the upper surface of the diffusion-preventive layer 90, a piezoelectric layer 81 which is formed to range over the plurality of pressure chambers 14 on the upper surface of the diffusion-preventive layer 90 formed with the lower electrode 82, and upper electrodes 84 which are formed on the upper surface of the piezoelectric layer 81.

The vibration plate 80 is a plate formed of a metal material having a substantially rectangular shape as viewed in a plan view. For example, the vibration plate 80 is formed of an iron-based alloy such as stainless steel, a copper-based alloy, a nickel-based alloy, or a titanium-based alloy. The vibration plate 80 is stacked and joined to the upper surface of the pressure chamber plate 10 to cover the openings of the plurality of pressure chambers 14. Grooves 86, which extend in the longitudinal direction of the pressure chambers 14, are formed between the two pressure chambers 14 closest to one another as viewed in a plan view (pressure chambers 14 adjoining in the short side direction of the pressure chambers) on the upper surface of the vibration plate 80 (on the surface disposed on the side opposite to the flow passage unit 200). The groove 86 is formed commonly to the two pressure chambers 14 in the area between the two adjoining pressure chambers 14. However, the shape of the groove 86 is not limited to the above. For example, it is also allowable to adopt a shape which extends along the edge of the pressure chamber 14 in area not overlapped with the plurality of pressure chambers 14 as viewed in a plan view on the upper surface of the vibration plate 80 and which surrounds the pressure chamber 14 except for the end of the pressure chamber 14 disposed on the side of the manifold 17.

The diffusion-preventive layer 90 is an insulating film formed of, for example, a ceramics material such as alumina and zirconia. The diffusion-preventive layer 90 functions to avoid the diffusion of metal elements such as Fe and Cr contained in the vibration plate 80 into the piezoelectric layer 81. The diffusion-preventive layer 90 is formed continuously to cover the plurality of pressure chambers 14. Grooves 88, which have the same or equivalent shapes as those of the grooves 86, are formed at positions of the diffusion-preventive layer 90 corresponding to the grooves 86 formed on the vibration plate 80.

The lower electrode 82 is formed of a conductive material such as gold. In this embodiment, the lower electrode 82 is formed as the common electrode which is provided to range over the plurality of pressure chambers 14. The lower electrode 82, which serves as the common electrode, faces a plurality of upper electrodes 84 as described later on to generate the electric field on the piezoelectric layer 81 between the lower electrode 82 and the upper electrodes 84.

The piezoelectric layer 81 contains a main component of lead zirconium titanate (PZT) which is a ferroelectric and which is a solid solution of lead titanate and lead zirconate. The piezoelectric layer 81 is formed to range over the plurality of pressure chambers 14. Grooves 87, which have the same or equivalent shapes as those of the grooves 86, are formed at positions of the piezoelectric layer 81 corresponding to the grooves 86 formed on the vibration plate 80.

The upper electrodes 84 are formed of a conductive material such as gold. In this embodiment, the upper electrodes 84 are formed as the individual electrodes provided to correspond to the plurality of pressure chambers 14 respectively. Each of the upper electrodes 84 has an elliptic (oval) planar shape which is one size smaller than that of the pressure chamber 14. The upper electrodes 84 are formed respectively at positions overlapped with central portions of the corresponding pressure chambers 14 as viewed in a plan view on the surface of the piezoelectric layer 81. Further, terminals 85, which are connected to the upper electrodes 84, are formed at ends, of the upper electrodes 14, on the side opposite to the nozzles 16 in the longitudinal direction. The plurality of terminals 85 are electrically connected to a driver IC (not shown) via a flexible wiring member such as a flexible printed circuit board. The driving voltage is selectively supplied from the driver IC via the terminals 85 to the plurality of upper electrodes 84.

In the case of the piezoelectric actuator 300 described above, the lower electrode 82 is the common electrode, and the upper electrodes 84 are the individual electrodes. However, reversely to the above, it is also allowable that the lower electrodes 82 are the individual electrodes, and the upper electrode 84 is the common electrode. However, in this case, it is necessary that the wiring member, which is connected to terminals 85 provided for the individual electrodes, should be insulated.

Next, an explanation will be made about the function of the piezoelectric actuator 300 in the ink-jet head 3. When the driving voltage is selectively applied from the driver IC to the plurality of upper electrodes 84, then the difference in the electric potential arises between the upper electrode 84 which is disposed on the upper side of the piezoelectric layer 81 and which is supplied with the driving voltage and the lower electrode 82 which is disposed on the lower side of the piezoelectric layer 81 and which is retained at the ground electric potential, and the electric field in the vertical direction is generated at the portion of the piezoelectric layer 81 interposed between the upper electrode 84 and the lower electrode 82. Accordingly, the portion of the piezoelectric layer 81, which is disposed just under the upper electrode 84 applied with the driving voltage, is constructed in the horizontal direction (planar direction) perpendicular to the direction of polarization (thickness direction). In this situation, the vibration plate 80 is deformed so that the vibration plate 80 is projected toward the pressure chamber 14 in accordance with the construction of the piezoelectric layer 81. Therefore, the volume in the pressure chamber 14 is decreased, and the pressure is applied to the ink contained in the pressure chamber 14. The ink is jetted from the nozzle 20 communicated with the pressure chamber 14.

In the case of a conventional ink-jet head, the plurality of pressure chambers 14 are arranged crowdedly along the plane. Therefore, the phenomenon, i.e., the so-called crosstalk tends to arise such that when the driving voltage is applied to the upper electrode 84 corresponding to a certain pressure chamber 14, and the piezoelectric layer 81 and the vibration plate 80, which are disposed at the positions overlapped with the certain pressure chamber 14, are deformed, then the deformation is propagated to portions of the piezoelectric layer 81 and the vibration plate 80 which cover the adjoining pressure chamber 14. However, as described above, the grooves 86, 87, 88, which extend along the edges of the pressure chambers 14 and which intervene between the adjoining pressure chambers 14, are formed in the areas which are not overlapped with the pressure chambers 14 as viewed in a plan view, of the vibration plate 80, the diffusion-preventive layer 90, and the piezoelectric layer 81. The thicknesses of the vibration plate 80 and the piezoelectric layer 81 are thin in the areas formed with the grooves 86, 87, 88 as compared with the other areas. Therefore, the deformations of the vibration plate 80 and the piezoelectric layer 81 which are stacked on a certain pressure chamber 14 are hardly propagated to the portions of the vibration plate 80 and the piezoelectric layer 81 which cover the other adjoining pressure chamber 14. Therefore, it is possible to reliably suppress the crosstalk.

Figure 5:
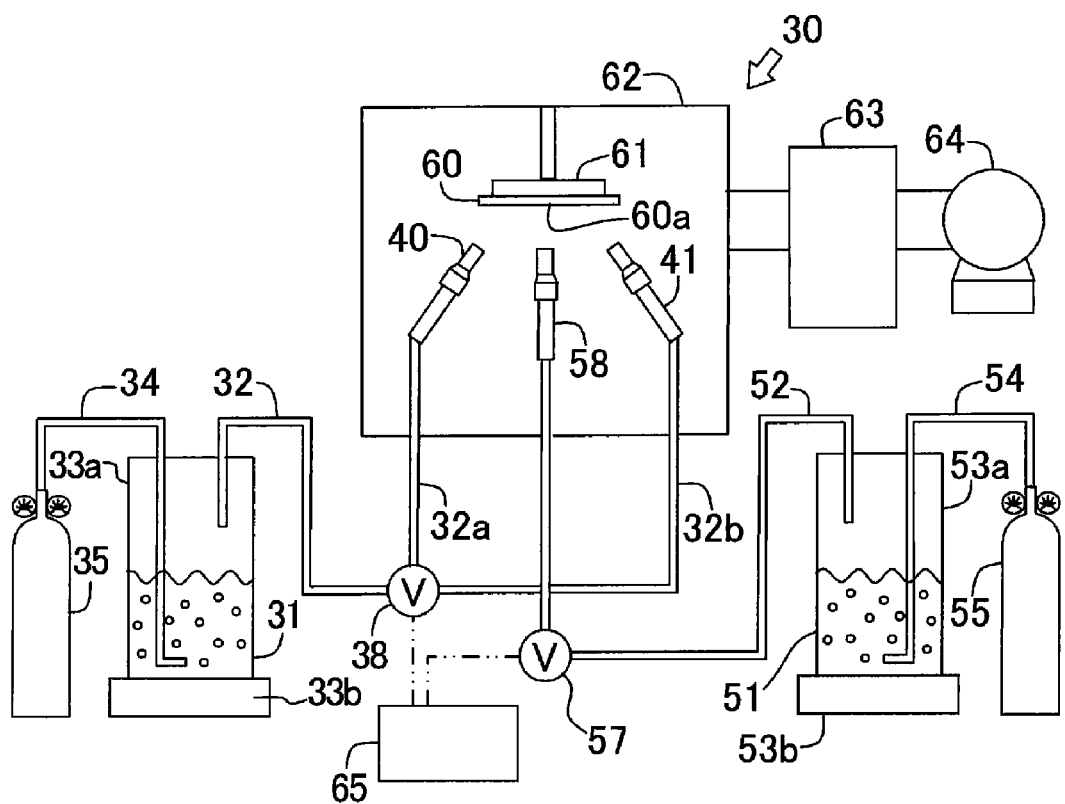
FIG. 5 shows a block diagram illustrating a schematic arrangement of a film-forming apparatus.

The diffusion-preventive layer 90 and the piezoelectric layer 81 are formed as the films by using a film-forming apparatus for carrying out the aerosol deposition method (hereinafter referred to as "AD method") in the steps of producing the piezoelectric actuator 300 of the ink-jet head 3 constructed as described above. Accordingly, the schematic arrangement of the film-forming apparatus will be explained with reference to FIG. 5. FIG. 5 shows a block diagram illustrating the schematic arrangement of the film-forming apparatus.

The film-forming apparatus 30 includes a first aerosol generator 31 which forms the aerosol by dispersing diffusion-preventive material particles in a carrier gas, and a first jetting nozzle 40 and a second jetting nozzle 41 which jet the aerosol generated in the first aerosol generator 31 toward a film formation objective 60. The film-forming apparatus 30 further includes a second aerosol generator 51 which forms the aerosol by dispersing piezoelectric material particles in the carrier gas, a third jetting nozzle 58 which jets the aerosol generated in the second aerosol generator 51 toward the film formation objective 60, and a film-forming chamber 62 which accommodates the jetting nozzles 40, 41, 58 and the film formation objective 60 arranged therein.

The first aerosol generator 31 is provided with an aerosol chamber 33a which accommodates the diffusion-preventive material particles therein, and a vibrator 33b which is attached to the aerosol chamber 33a and which vibrates the aerosol chamber 33a. A gas bomb 35 is connected to the aerosol chamber 33a via an introducing tube 34 in order to introduce the carrier gas. The forward end of the introducing tube 34 is positioned in the vicinity of the bottom surface in the aerosol chamber 33a, which is buried in the material particles. The diffusion-preventive material particles are fine particles of ceramics such as alumina and zirconia for preventing the diffusion of the metal elements contained in the vibration plate 80 into the piezoelectric layer 81. Those usable as the carrier gas include, for example, inert gases such as helium, argon, and nitrogen, air, and oxygen.

An aerosol supply tube 32 is connected to the aerosol chamber 33a in order to supply the aerosol contained in the aerosol chamber 33a to the jetting nozzles 40, 41. The aerosol supply tube 32 is branched into two supply tubes 32a, 32b by the aid of a switching valve 38. The first jetting nozzle 40 and the second jetting nozzle 41 are connected to the two supply tubes 32a, 32b respectively. The switching valve 38 is operated by receiving the instruction from a controller 65. The switching valve 38 is capable of making the switching into three states, i.e., a state in which the aerosol is supplied to the first jetting nozzle 40, a state in which the aerosol is supplied to the second jetting nozzle 41, and a state in which the aerosol supply tube 32 is closed.

The second aerosol generator 51 is provided with an aerosol chamber 53a which is accommodates the piezoelectric material particles therein, and a vibrator 53b which is attached to the aerosol chamber 53a and which vibrates the aerosol chamber 53a. A gas bomb 55 is connected to the aerosol chamber 53a via an introducing tube 54 in order to introduce the carrier gas. The forward end of the introducing tube 54 is positioned in the vicinity of the bottom surface in the aerosol chamber 53a, which is buried in the material particles. The piezoelectric material is, for example, lead zirconium titanate (PZT) which is a ferroelectric and which is a solid solution of lead titanate and lead zirconate. Those usable as the carrier gas include, for example, inert gases such as helium, argon, and nitrogen, air, and oxygen.

An aerosol supply tube 52 is connected to the aerosol chamber 53a in order to supply the aerosol contained in the aerosol chamber 53a to the third jetting nozzle 58. The aerosol supply tube 52 is provided with a switching valve 57 which is operated by receiving the instruction from the controller 65. The switching valve 57 is capable of making the switching into a state in which the aerosol is supplied to the third jetting nozzle 58 and a state in which the aerosol supply tube 52 is closed.

The film-forming chamber 62 is provided with a stage 61 which is provided to attach the film formation objective 60, and the jetting nozzles 40, 41, 58 which are provided under or below the stage 61. A vacuum pump 64 is connected to the film-forming chamber 62 via a powder recovery unit 63. It is possible to reduce the pressure in the film-forming chamber 62.

The three jetting nozzles 40, 41, 58 are arranged in the film-forming chamber 62 so that the third jetting nozzle 58 is interposed between the first jetting nozzle 40 and the second jetting nozzle 41. The third jetting nozzle 58, which is included in the jetting nozzles 40, 41, 58, is arranged so that the jetting direction thereof is substantially perpendicular to the film formation surface 60a of the film formation objective 60 retained on the stage 61. On the other hand, the jetting directions of the first jetting nozzle 40 and the second jetting nozzle 41 are not perpendicular to the film formation surface 60a of the film formation objective 60 retained on the stage 61. It is appropriate that the jetting directions of the first jetting nozzle 40 and the second jetting nozzle 41 have an inclination of, for example, about 60 to 80°. It is desirable that the horizontal components of the jetting directions of the first jetting nozzle 40 and the second jetting nozzle 41 are opposed to one another. The "jetting directions" of the jetting nozzles 40, 41, 58 herein refer to the axial directions of the jetting nozzles 40, 41, 58. The "horizontal components" of the jetting directions refer to the components of the jetting directions substantially parallel to the film formation surface 60a.

Figure 6A:
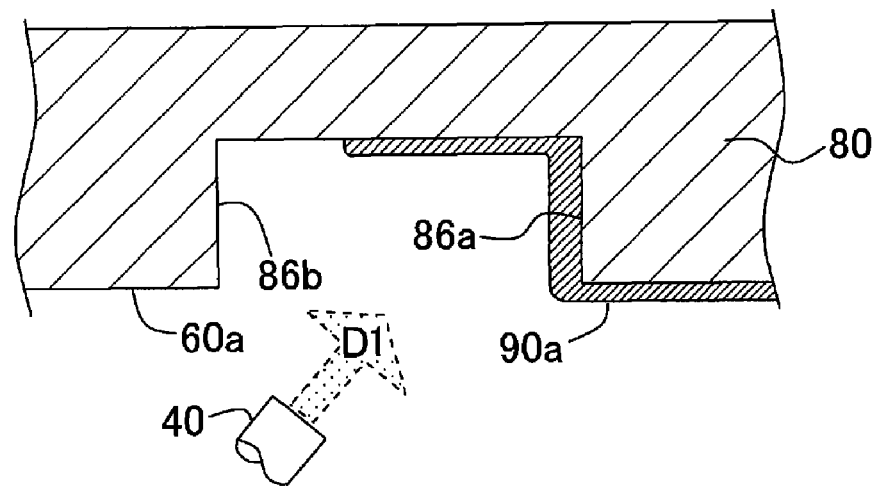
FIG. 6A shows a partial magnified sectional view illustrating a vibration plate at a first diffusion-preventive material-blowing stage in a diffusion-preventive layer-forming step.
Figure 6B:
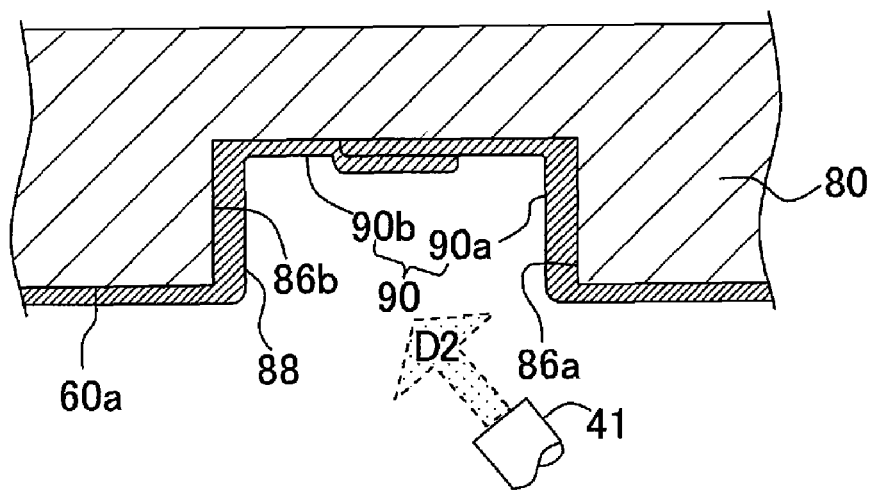
FIG. 6B shows a partial magnified sectional view illustrating the vibration plate at a second diffusion-preventive material-blowing stage.
Figure 7A:
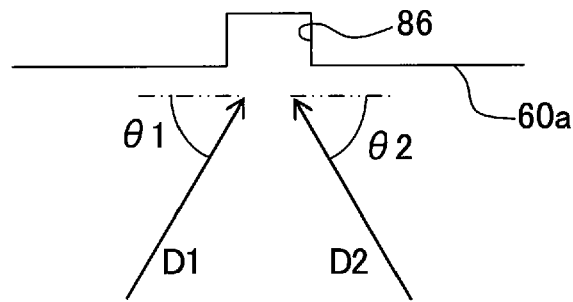
FIG. 7A shows a side view illustrating the relationship between the vibration plate and the blowing directions of the aerosol.
Figure 7B:
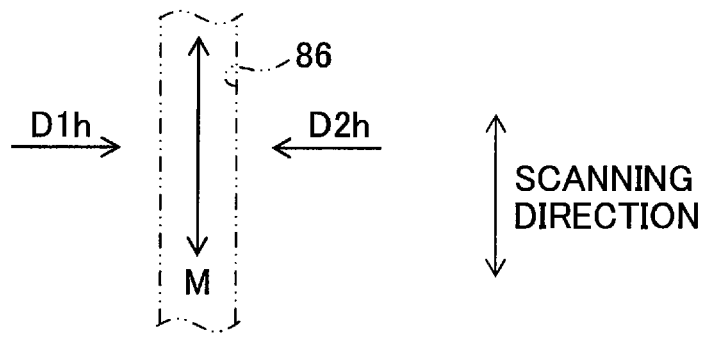
FIG. 7B shows a plan view illustrating the relationship between the vibration plate and the blowing directions of the aerosol.
Figure 8:
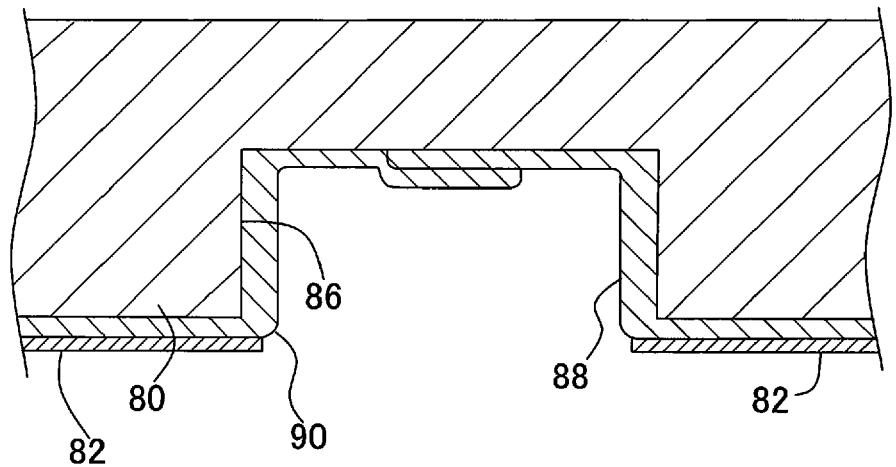
FIG. 8 shows a partial magnified sectional view illustrating the vibration plate to explain a lower electrode-forming step.
Figure 9:
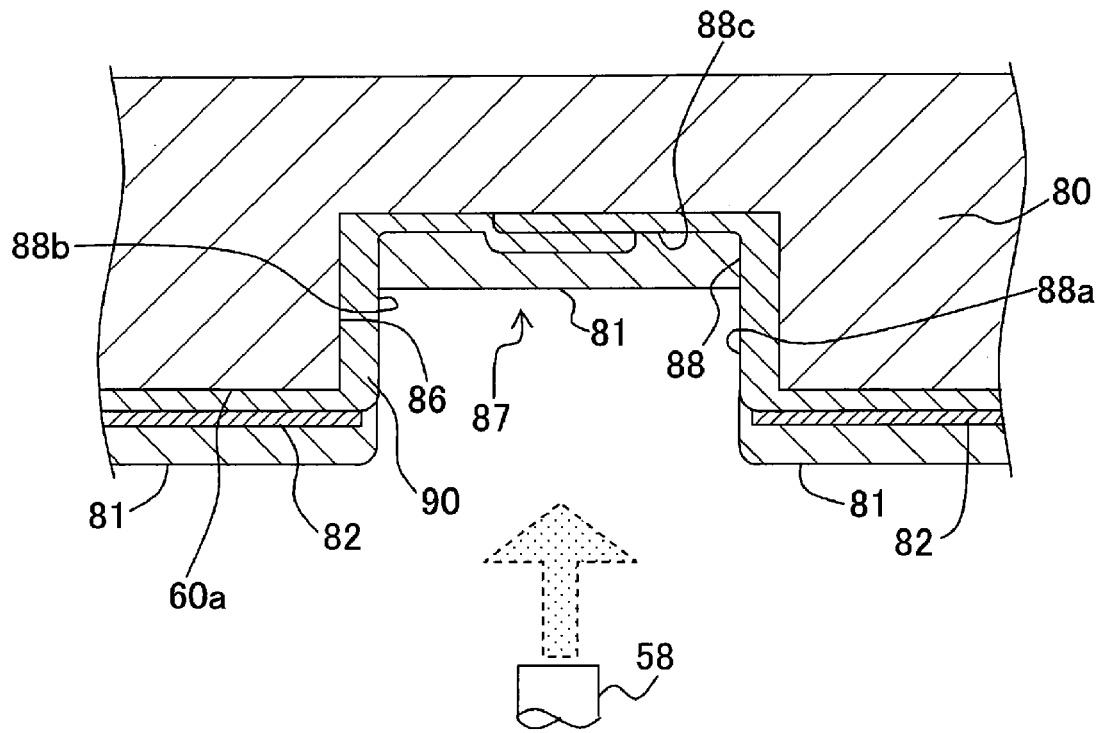
FIG. 9 shows a partial magnified sectional view illustrating the vibration plate to explain a piezoelectric layer-forming step.
Figure 10:
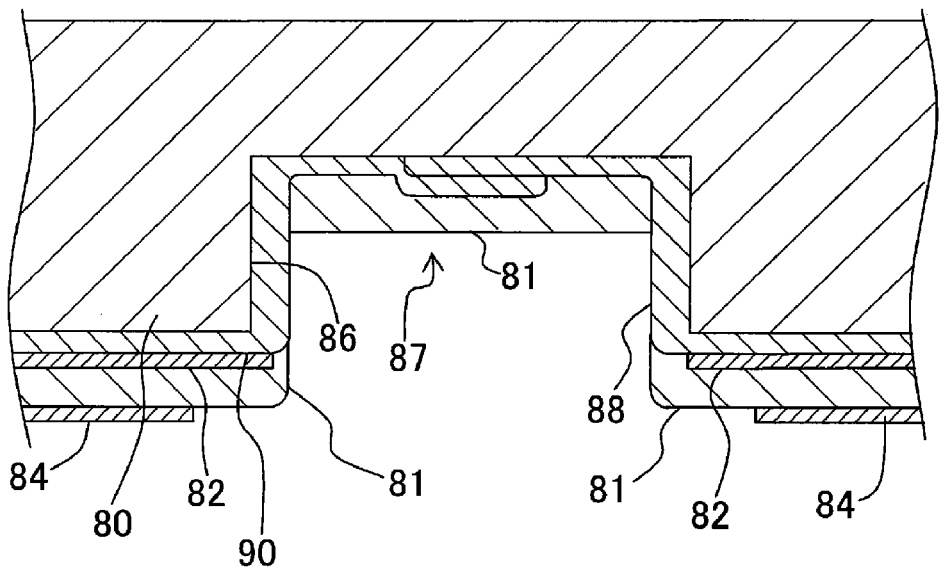
FIG. 10 shows a partial magnified sectional view illustrating the vibration plate to explain an upper electrode-forming step.
Figure 11:
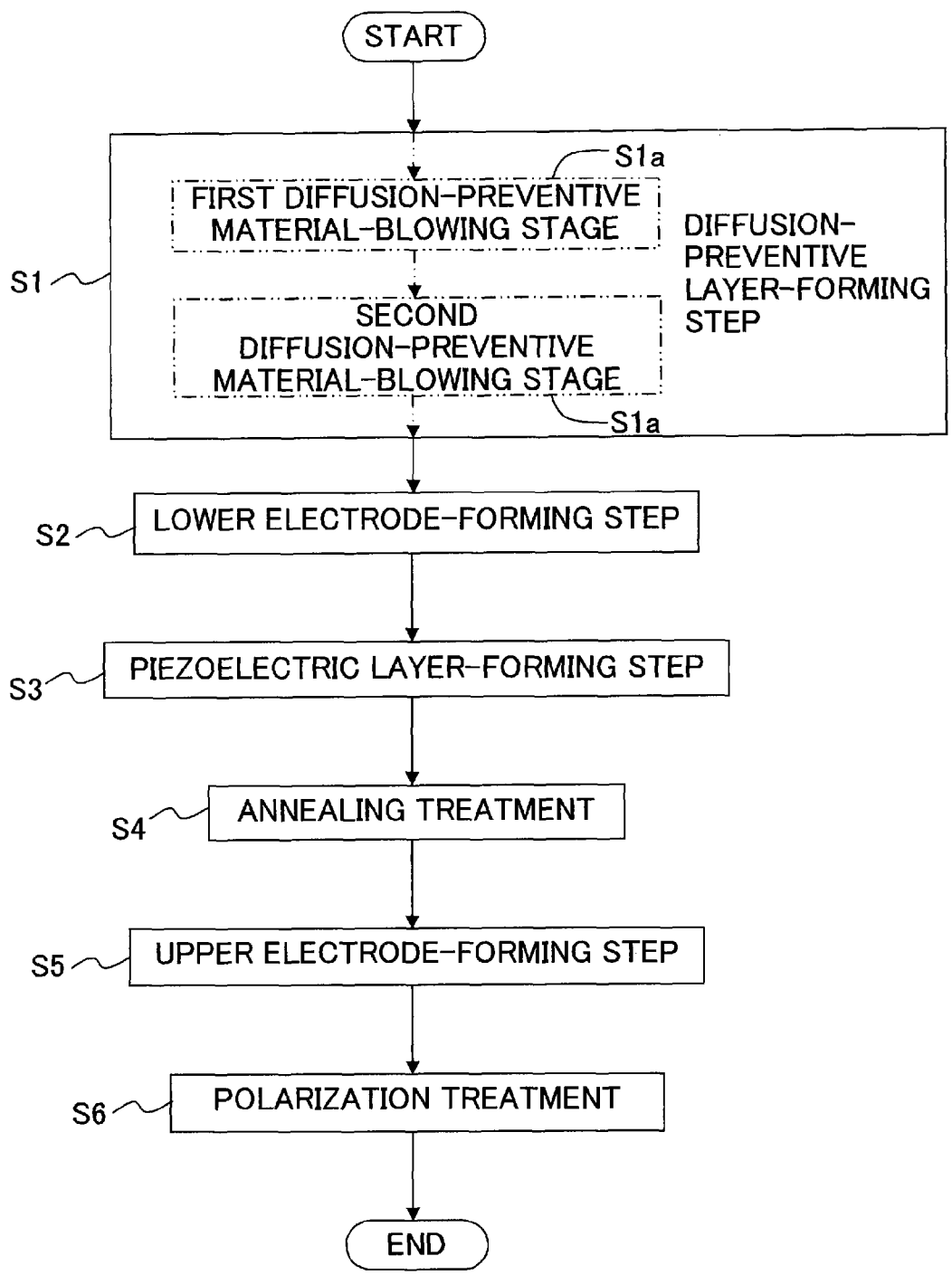
FIG. 11 shows a flow chart illustrating the process for producing the piezoelectric actuator.

A method for producing the ink-jet head 3 will now be explained. In particular, an explanation will be made in detail with reference to FIGS. 6 to 11 about a method for producing the piezoelectric actuator 300 by using the film-forming apparatus 30 described above. FIG. 6 illustrates a diffusion-preventive layer-forming step, wherein FIG. 6A shows a partial magnified sectional view illustrating the vibration plate at a first diffusion-preventive material-blowing stage, and FIG. 6B shows a partial magnified sectional view illustrating the vibration plate at a second diffusion-preventive material-blowing stage. FIG. 7 illustrates an example of the blowing directions of the aerosol with respect to the vibration plate, wherein FIG. 7A shows a side view illustrating the relationship between the vibration plate and the blowing directions, and FIG. 7B shows a plan view illustrating the relationship between the vibration plate and the blowing directions. FIG. 8 shows a partial magnified sectional view illustrating the vibration plate to explain a lower electrode-forming step. FIG. 9 shows a partial magnified sectional view illustrating the vibration plate to explain a piezoelectric layer-forming step. FIG. 10 shows a partial magnified sectional view illustrating the piezoelectric actuator 300 to explain an upper electrode-forming step. FIG. 11 shows a flow chart illustrating the process for producing the piezoelectric actuator 300.

At first, the flow passage unit 200 is produced. In this procedure, the pressure chamber plate 10, the base plate 11, the manifold plate 12, and the nozzle plate 13, in which the holes to form the individual liquid flow passages 21 including the pressure chambers 14 are formed, are positioned respectively, and they are successively stacked and joined to one another. Accordingly, the flow passage unit 200 is formed. The vibration plate 80 is stacked on the upper surface of the pressure chamber plate 10 of the flow passage unit 200 while being positioned so that the respective pressure chambers 14 are closed, and the pressure chamber plate 10 and the vibration plate 80 are joined to one another. In this situation, the grooves 86 are previously formed on the vibration plate 80, for example, by the etching process at the positions corresponding to the surroundings of the pressure chambers 14 of the flow passage unit 200. In this embodiment, an explanation will be made about a case in which the cross-sectional shape of the groove 86 is U-shaped.

Subsequently, the diffusion-preventive layer 90 is formed by using the AD method on the vibration plate 80 formed with the grooves 86 (diffusion-preventive layer-forming step (Step S1)). The diffusion-preventive layer-forming step (Step S1) includes a first diffusion-preventive material-blowing stage (Step S1a) in which the aerosol containing the diffusion-preventive material particles is blown toward the vibration plate 80 from the first jetting nozzle 40 and a second diffusion-preventive material-blowing stage (Step S1b) in which the aerosol containing the diffusion-preventive material particles is blown toward the vibration plate 80 from the second jetting nozzle 41. In other words, the aerosol is blown toward the plurality of mutually different directions toward the same area or range of the vibration plate 80.

The film-forming apparatus 30 is used in this situation. At first, the vibration plate 80, on which the grooves 86 are previously formed, is attached as the film formation objective 60 to the stage 61 of the film-forming apparatus 30. In this situation, the vibration plate 80 is arranged on the stage 61 so that the surface of the vibration plate 80, on which the grooves 86 are formed, is the film formation surface 60a, and the extending direction of the grooves 86 is not parallel to the horizontal components of the jetting directions of the jetting nozzles 40, 41. Subsequently, the carrier gas is introduced from the gas bomb 35, and the material particles are flown up by the gas pressure. Further, the aerosol chamber 33a is vibrated by the vibrator 33b, and thus the carrier gas and the material particles are mixed with each other to generate the aerosol. The pressure is reduced in the film-forming chamber 62 by the vacuum pump 64. The switching valve 38 is switched so that the aerosol supply tube 32, which has been closed by the controller 65, supplies the aerosol to the first jetting nozzle 40. Accordingly, the aerosol, which is contained in the aerosol chamber 33a, is jetted from the first jetting nozzle 40 while being accelerated at the high speed due to the pressure difference between the aerosol chamber 33a and the film-forming chamber 62. Subsequently, the switching valve 38 is switched by the controller 65 so that the aerosol is supplied to the second jetting nozzle 41. The aerosol, which is contained in the aerosol chamber 33a, is jetted from the second jetting nozzle 41 while being accelerated at the high speed. In this way, the material particles, which are contained in the aerosol jetted from the jetting nozzles 40, 41, are collided with the vibration plate 80, and the material particles are accumulated or deposited thereon. As a result, a film, which contains the main component of the diffusion-preventive material, is formed on the vibration plate 80, and the film serves as the diffusion-preventive layer 90.

As described above, the diffusion-preventive layer-forming step (Step S1) includes the stage (FIG. 6A) in which the aerosol containing the diffusion-preventive material particles is blown from the first direction D1 from the jetting nozzle 40 toward the same area of the surface of the vibration plate 80 formed with the grooves 86 and the stage (FIG. 6B) in which the aerosol containing the diffusion-preventive material particles is blown from the second direction D2 different from the first direction D1 from the second jetting nozzle 41 thereagainst. That is, the aerosol is blown from the plurality of mutually different directions toward the same area, of the vibration plate 80, in which the grooves 86 are formed. In this procedure, as shown in FIG. 7A, it is desirable that each of the first direction D1 and the second direction D2 is not perpendicular to the film formation surface 60a (surface of the vibration plate 80 disposed on the side on which the grooves 86 are formed), and each of the first direction D1 and the second direction D2 has an inclination θ1, θ2 of, for example, about 60 to 80°. Further, as shown in FIG. 7B, it is desirable that each of the horizontal components D1h, D2h of the first direction D1 and the second direction D2 has an inclination with respect to the extending direction M of each of the grooves 86 of the vibration plate 80 (i.e., the horizontal components D1h, D2h are not parallel to the extending direction M of each of the grooves 86), and the components of the horizontal components D1h, D2h of the first direction D1 and the second direction D2, which are substantially perpendicular to the extending direction M of the groove 86, are opposed to one another. In this arrangement, when the aerosol is blown from the plurality of different directions as described above, the positions of the portions, at which the film thicknesses of the films to be formed on the surface of each of the grooves 86 of the vibration plate 80 are minimum, are different from each other.

As shown in FIG. 6A, in the first diffusion-preventive material-blowing stage (Step S1a), the film 90a is formed such that the material particles are deposited by making the collision with one side surface 86a of the two side surfaces 86a, 86b extending in the extending direction of the groove 86 formed on the vibration plate 80, but the material particles are not deposited on the other side surface 86b. Therefore, in the first diffusion-preventive material-blowing stage (Step S1a), the other side surface 86b of the groove 86 of the vibration plate 80 is the minimum portion of the film thickness of the film formed on the surface of the groove 86 of the vibration plate 80.

On the other hand, as shown in FIG. 6B, in the second diffusion-preventive material-blowing stage (Step S1b), the material particles are not deposited on the side surface 86a on which the material particles have been deposited in the first diffusion-preventive material-blowing stage (Step S1a), of the two side surfaces 86a, 86b extending in the extending direction of the groove 86 formed on the vibration plate 80. However, the film 90b is formed such that the material particles are deposited by making the collision with the other side surface 86b. Therefore, in the second diffusion-preventive material-blowing stage (Step S1b), the side surface 86a of the groove 86 of the vibration plate 80, on which the material particles have been deposited in the first diffusion-preventive material-blowing stage (Step S1a), is the minimum portion of the film thickness of the film formed on the surface of the groove 86 of the vibration plate 80.

As described above, as a result of the execution of the first diffusion-preventive material-blowing stage (Step S1a) and the second diffusion-preventive material-blowing stage (Step S1b), the material particles are collided with the side surfaces 86a, 86b of the groove 86 as the recess formed on the vibration plate 80 as well, and the material particles are deposited thereon. Therefore, the diffusion-preventive layer 90 can be formed on the vibration plate 80 without causing any unevenness. It is possible to eliminate any portion at which the thickness of the layer of the diffusion-preventive layer 90 is extremely thin.

In this embodiment, the aerosol is blown toward the groove 86 of the vibration plate 80 from the two different directions in the first diffusion-preventive material-blowing stage (Step S1a) and the second diffusion-preventive material-blowing stage (Step S1b). However, the number of the blowing directions of the aerosol and the number of times of the blowing are not limited thereto. The diffusion-preventive layer 90 can be formed without causing any unevenness on the grooves 86 formed on the vibration plate 80 including the inner wall surfaces, even when the aerosol is additionally blown from any direction or directions different from the two directions, on condition that the blowing direction of the aerosol includes at least the two different directions as described above. The first diffusion-preventive material-blowing stage (Step S1a) and the second diffusion-preventive material-blowing stage (Step S1b) can be performed successively or sequentially respectively. The first diffusion-preventive material-blowing stage (Step S1a) and the second diffusion-preventive material-blowing stage (Step S1b) can be performed at the same time as well by simultaneously performing the jetting operation from the first jetting nozzle 40 and the second jetting nozzle 41. In this embodiment, the film-forming apparatus 30 is provided with the two jetting nozzles, i.e., the first jetting nozzle 40 and the second jetting nozzle 41. However, the film-forming apparatus 30 may be provided with one jetting nozzle, and the angle of the stage 61 with respect to the jetting direction of the jetting nozzle may be made variable so that the angle of the film formation surface may be made variable with respect to the jetting direction of the jetting nozzle.

Subsequently, the lower electrode 82 is formed on the diffusion-preventive layer 90 (lower electrode-forming step (Step S2)). As shown in FIG. 8, the lower electrode 82 is formed at the portion which is not overlapped with the grooves 86 of the diffusion-preventive layer 90 stacked on the vibration plate 80 by using, for example, the screen printing method, the sputtering method, or the vapor deposition method.

Further, the piezoelectric layer 81 is formed on the diffusion-preventive layer 90 having been formed with the lower electrode 82 (piezoelectric layer-forming step (Step S3)). In this procedure, the film-forming apparatus 30 is used again. At first, the vibration plate 80, on which the diffusion-preventive layer 90 and the lower electrode 82 have been formed, is attached as the film formation objective 60 to the stage 61 of the film-forming apparatus 30. Subsequently, the carrier gas is introduced from the gas bomb 55, and the material particles are flown up by the gas pressure. Further, the aerosol chamber 53a is vibrated by the vibrator 53b, and thus the carrier gas and the material particles are mixed with each other to generate the aerosol. The pressure is reduced in the film-forming chamber 62 by the vacuum pump 64. The switching valve 57 is switched so that the aerosol supply tube 52, which has been closed by the controller 65, supplies the aerosol to the third jetting nozzle 58. As a result, the aerosol, which is contained in the aerosol chamber 53a, is accelerated at the high speed due to the pressure difference between the aerosol chamber 53a and the film-forming chamber 62, and the aerosol is jetted from the third jetting nozzle 58. The material particles, which are contained in the jetted aerosol, are collided with the diffusion-preventive layer 90 or the lower electrode 82 to cause the deposition, and the film to serve as the piezoelectric layer 81 is formed.

As shown in FIG. 9, the blowing of the aerosol is performed in the piezoelectric layer-forming step (Step S3) by the third jetting nozzle 58 having the jetting direction which is substantially perpendicular to the film formation surface 60a. Therefore, the material particles are deposited on the bottom portions 88c of the grooves 88 of the diffusion-preventive layer 90. However, the material particles are not deposited on the side wall portions 88a, 88b. Even when the material particles are deposited on the side wall portions 88a, 88b, the thickness is extremely small. The piezoelectric layer 81, which is formed as the film on the film formation surface as described above (on the surface of the diffusion-preventive layer 90 provided with the lower electrode 82), has the extremely small thickness of the side wall portions of the grooves 87, and the piezoelectric layer 81 is discontinuous. The arrangement, in which the thickness is extremely small at the side wall portions of the grooves 87 of the piezoelectric layer 81 as described above, is excellent in that the function of the grooves 86 formed on the vibration plate 80 is not inhibited.

Subsequently, the annealing treatment is performed for the formed piezoelectric layer 81 in order to obtain the necessary piezoelectric characteristic (Step S4). In this procedure, the metal elements, which are contained in the vibration plate 80 made of stainless steel, are not diffused into the piezoelectric layer 81 owing to the presence of the diffusion-preventive layer 90 which has been formed without causing any unevenness between the vibration plate 80 and the piezoelectric layer 81.

Subsequently, the upper electrodes 84 and the plurality of terminals 85 connected to the upper electrodes 84 are formed on the upper surface of the piezoelectric layer 81 (upper electrode-forming step (Step S5)). When the upper electrodes 84 and the terminals 85 are formed, for example, the following procedure is also available. That is, a conductor film may be formed in the entire region on the upper electrodes 84, and then unnecessary portions may be removed by utilizing the photolithography etching method to form the predetermined pattern. Alternatively, the upper electrodes 84 and the terminals 85 may be directly formed on the upper surface of the piezoelectric layer 81 by the screen printing.

After that, the magnetic field, which is stronger than that used when the ordinary ink-jetting operation is performed, is applied between the upper electrodes 84 and the lower electrode 82 to perform the polarization treatment in which the piezoelectric layer 81 disposed between the both electrodes is polarized in the thickness direction (Step S6). In accordance with the procedure as described above, the piezoelectric actuator 300 is formed, which is constructed by successively stacking the diffusion-preventive layer 90, the lower electrode 82, the piezoelectric layer 81, and the upper electrodes 84 on the vibration plate 80 joined to the pressure chamber plate 10 of the flow passage unit 200, and thus the ink-jet head 3 is completed. The pressure chamber plate 10 of the flow passage unit 200 may be joined to the vibration plate 80 after the polarization treatment (Step S6).

The embodiment described above is illustrative of the case in which the cross-sectional shape of the groove 86 formed on the vibration plate 80 is U-shaped. However, the cross-sectional shape of the groove 86 is not limited to the U-shaped form. The effect, which is the same as or equivalent to the effect of the embodiment described above, can be obtained by the method for producing the piezoelectric actuator according to the embodiment described above, provided that the groove 86 has such a cross-sectional shape that the portion, at which the thickness of the diffusion-preventive layer formed on the surface of the groove 86 is minimum, is generated when the diffusion-preventive layer 90 is formed by blowing the ceramics material from one predetermined direction by using the AD method toward the surface of the vibration plate 80 on which the groove 86 is formed.

In the embodiment of the present invention described above, the explanation has been made about the example in which the present invention is applied to the ink-jet head 3 which is attached to the lower surface of the carriage 2 and which discharges the inks from the nozzles 20 formed on the lower surface thereof while reciprocating in the scanning direction together with the carriage 2. However, the present invention is not limited thereto. For example, the present invention is also applicable to a line type head in which a plurality of nozzles are aligned in series in the scanning direction. In this case, it is unnecessary to reciprocatively move the ink-jet head in the scanning direction, and the carriage 2 is not indispensable.

The explanation has been made above about the case in which the present invention is applied to the method for producing the piezoelectric actuator to be used for the ink-jet head. However, the applicable range of the present invention is not limited thereto. For example, the way of use of the piezoelectric actuator is not limited to the ink-jet head, and the piezoelectric actuator may be used for any liquid discharge head for discharging any liquid other than the ink. The piezoelectric actuator, which is produced by the producing method of the present invention, may be used to drive driving units of various apparatuses.

What is claimed is:

1. A method for producing a piezoelectric actuator having a diffusion-preventive layer and a piezoelectric layer stacked on a vibration plate, the method comprising the steps of:
   providing the vibration plate having a surface on which a groove is formed, wherein the groove has a first side and a second side on opposing sides of a bottom portion;
   forming the diffusion-preventive layer by blowing an aerosol containing ceramics particles toward an area on the surface of the vibration plate in which the groove is formed from a plurality of different directions that are angled with respect to the surface of the vibration plate such that the ceramic particles are deposited evenly on the first side, second side, and bottom portion of the groove, wherein the ceramics particles prevent diffusion of an element contained in the vibration plate into the piezoelectric layer; and
   forming the piezoelectric layer by blowing an aerosol containing piezoelectric material particles toward an area on the surface of the vibration plate in which the diffusion-preventive layer is formed from a direction that is perpendicular to the surface of the vibration plate such that the piezoelectric material particles are deposited with less thickness at the first side and second side of the groove than at the bottom portion of the groove, wherein the piezoelectric material particles generate an electric field when a driving voltage is applied.

2. The method for producing the piezoelectric actuator according to claim 1, wherein the vibration plate is formed of a metal material.

3. The method for producing the piezoelectric actuator according to claim 1, wherein a position at which a film thickness of the diffusion-preventive layer formed on the second side of the groove is at a minimum when the aerosol containing ceramics particles is blown from a first direction is located at a position different from that at which a film thickness of the diffusion-preventive layer formed on the first side of the groove is at minimum when the aerosol containing ceramics particles is blown from a second direction.

4. The method for producing the piezoelectric actuator according to claim 3, wherein both of the first direction and the second direction have inclinations which are not perpendicular to the surface of the vibration plate; and a horizontal component of the first direction, which is substantially parallel to the surface of the vibration plate and a horizontal component of the second direction, which is substantially parallel to the surface of the vibration plate both have inclinations with respect to an extending direction in which the groove of the vibration plate extends.

5. The method for producing the piezoelectric actuator according to claim 4, wherein the horizontal component of the first direction and the horizontal component of the second direction are perpendicular to the extending direction of the groove, respectively, and are opposed to one another.

6. The method for producing the piezoelectric actuator according to claim 1, further comprising the step of:

forming an electrode, which applies the driving voltage to the piezoelectric layer, at another predetermined position on the diffusion-preventive layer formed on the vibration plate.

7. The method for producing the piezoelectric actuator according to claim 6, further comprising the step of:

forming another electrode, which applies the driving voltage to the piezoelectric layer, at a predetermined position on the piezoelectric layer.

8. The method for producing the piezoelectric actuator according to claim 1, wherein the step of forming the diffusion-preventive layer comprises:

blowing the aerosol containing ceramics particles in a first direction toward the second side of the groove with a first jetting nozzle; and blowing the aerosol containing ceramics particles in a second direction toward the first side of the groove with a second jetting nozzle, wherein the first jetting nozzle and second jetting nozzle are positioned on opposite sides of the groove.

9. The method for producing the piezoelectric actuator according to claim 8, wherein the step of forming the piezoelectric layer comprises blowing the aerosol containing piezoelectric material particles toward the bottom portion of the groove with a third jetting nozzle positioned between the first jetting nozzle and the second jetting nozzle.

10. The method for producing the piezoelectric actuator according to claim 9, wherein:

the aerosol containing ceramics particles is blown with the second jetting nozzle after before being blown with the first jetting nozzle; and the aerosol containing piezoelectric material particles is blown with the third jetting nozzle after the aerosol containing ceramics particles is blown with the first jetting nozzle and second jetting nozzle.

* * * * *